(12) United States Patent  (10) Patent No.: US 8,981,551 B2
Delpech et al.  (45) Date of Patent: Mar. 17, 2015

(54) SEMICONDUCTOR DEVICE COMPRISING A CRACK STOP STRUCTURE

(71) Applicant: STMicroelectronics (Crolles 2) SAS, Crolles (FR)

(72) Inventors: Philippe Delpech, Meylan (FR); Eric Sabouret, Saint Ismier (FR); Sebastien Gallois-Garreignot, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/032,618

(22) Filed: Sep. 20, 2013

(65) Prior Publication Data

US 2014/0091451 A1   Apr. 3, 2014

(30) Foreign Application Priority Data

Oct. 1, 2012  (FR) .................................... 12 59258

(51) Int. Cl.
*H01L 23/48*  (2006.01)
*H01L 23/00*  (2006.01)
*H01L 21/50*  (2006.01)

(52) U.S. Cl.
CPC .............. *H01L 23/562* (2013.01); *H01L 21/50* (2013.01); *H01L 24/05* (2013.01); *H01L 2224/02235* (2013.01)
USPC ......................................... 257/692; 438/121

(58) Field of Classification Search
CPC ....... H01L 24/05; H01L 21/50; H01L 23/562; H01L 2224/02235
USPC .................................. 257/692, 773; 438/121
See application file for complete search history.

(56) References Cited

U.S. PATENT DOCUMENTS

| | | |
|---|---|---|
| 5,502,337 A | 3/1996 | Nozaki |
| 6,087,732 A | 7/2000 | Chittipeddi et al. |
| 2002/0145206 A1 | 10/2002 | Park et al. |
| 2005/0039944 A1 * | 2/2005 | Kim et al. ..................... 174/250 |
| 2005/0067707 A1 * | 3/2005 | Hashimoto et al. ........... 257/758 |
| 2005/0093176 A1 | 5/2005 | Hung et al. |
| 2008/0210935 A1 * | 9/2008 | Ebara .............................. 257/48 |
| 2009/0014882 A1 * | 1/2009 | Ito et al. ........................ 257/758 |
| 2010/0038773 A1 * | 2/2010 | Adkisson et al. .............. 257/698 |
| 2010/0263913 A1 * | 10/2010 | Daubenspeck et al. ....... 174/250 |
| 2011/0254154 A1 * | 10/2011 | Topacio et al. ................ 257/737 |
| 2012/0168961 A1 * | 7/2012 | Sakurai ......................... 257/774 |

FOREIGN PATENT DOCUMENTS

| | | |
|---|---|---|
| JP | 2010093163 A | 4/2010 |
| KR | 1020090036011 A | 4/2009 |

* cited by examiner

*Primary Examiner* — A. Sefer
(74) *Attorney, Agent, or Firm* — Allen, Dyer, Doppeli, Milbrath & Gilchrist, P.A.

(57) ABSTRACT

A semiconductor device may include at least one pad adjacent a top surface of the device, and a metal crack stop structure below the at least one pad. The metal crack structure may have an inner envelope and an outer envelope, and may be configured to be vertically aligned with the at least one pad so that an edge of the at least one pad is between the inner and outer envelopes.

22 Claims, 3 Drawing Sheets

SEMICONDUCTOR DEVICE COMPRISING A CRACK STOP STRUCTURE

FIELD OF THE INVENTION

The present invention relates to semiconductor packaging structures, especially a fan-out structure where a series of small, randomly located "chip pads" are connected to larger pads, arranged in a matrix on the chip, through a redistribution layer.

BACKGROUND OF THE INVENTION

FIG. 1 illustrates a semiconductor device 1 that includes a semiconductor substrate 10 within which an active region 20 (schematically shown in dotted lines) is formed. The active region generally includes active and passive electronic components, such as transistors, resistors, capacitors, and the like. A first level interconnect structure includes one or more dielectric layers 11 formed above the semiconductor substrate, and conductive lines (metal tracks) 21 are formed within the dielectric layer(s) to interconnect components of the active region. The top dielectric layer 12 of the first level interconnect structure includes conductive features 22, commonly known as "chip pads", and may be aluminum or "alucap".

A second level interconnect structure, known as a "redistribution layer", includes dielectric layers 13, 14 formed above layer 12, and respectively including conductive vias 23 and conductive lines 24, widening at their ends to form top pads 25. The conductive lines 24 are to redistribute electrical signals between the chip pads 22 and the pads 25, commonly arranged in a matrix on the semiconductor device. The dielectric layer 14 includes an opening 15 exposing the pad 25, such that an electrical coupling may be made between the pad and the exterior by, for example, solder balls.

During testing, packaging, and use, the pads 25 may be subjected to mechanical forces, such as test probes, pressure bonding, as well as thermo-mechanical stresses, for example when soldering the device to a package. In particular, the various materials employed in the fabrication of the semiconductor device, such as the pads and dielectric layers, have different mechanical properties and coefficients of thermal expansion. As a result, cracks may be likely to appear at the interfaces between the materials under most stress, in particular at the edges of pads 25. As shown, a crack 30 may appear at an edge 25' of the pad 25, and propagate down through the body of the semiconductor device, and may damage underlying conductive lines 21 or enter the active region 20, which may result in a defect or failure of the device such as an open or shorted connection.

As technology progresses, the size of the features 11, 21 of the first interconnect structure diminishes, and new materials with relatively poor mechanical properties are introduced, making the interconnect structure more sensitive to cracks and other defects. In contrast, the size of the pads 25 remains substantially constant such that the pads 25 become more massive with respect to the underlying structures, which may result in an increased stress between the pads and the underlying structures and a higher likelihood of crack formation. It may therefore be desirable to provide a semiconductor device that is more protected against such cracks.

SUMMARY OF THE INVENTION

Embodiments relate to a semiconductor device that includes at least one pad formed on or opening onto a top surface of the device. The semiconductor device further includes a metal crack stop structure arranged below the pad, conforming to an inner envelope and an outer envelope, and configured such that a vertical projection of the edge of the pad is between the inner and outer envelopes of the crack stop structure.

According to one embodiment, the pad is circular and the crack stop structure is annular. According to one embodiment, the top of the crack stop structure has an inner diameter and an outer diameter that fall outside a ±10° downward facing angle starting at the edge of the pad.

According to one embodiment, the crack stop structure has an average diameter equal to the diameter of the pad. According to one embodiment, the device includes a dielectric layer having electrical connection elements, and wherein the crack stop structure is formed in the dielectric layer and is of the same material as the connection elements.

According to one embodiment, the material of the crack stop structure includes copper or aluminum. According to one embodiment, the top surface of the crack stop structure includes radial walls to reduce horizontal propagation of cracks.

According to one embodiment, the crack stop structure has holes spaced along the projection of the pad edge. According to one embodiment, the crack stop structure is divided into regular sectors. According to one embodiment, a conductive track or feature traverses the crack stop structure.

DETAILED DESCRIPTION OF THE PREFERRED EMBODIMENTS

Figure 2A:
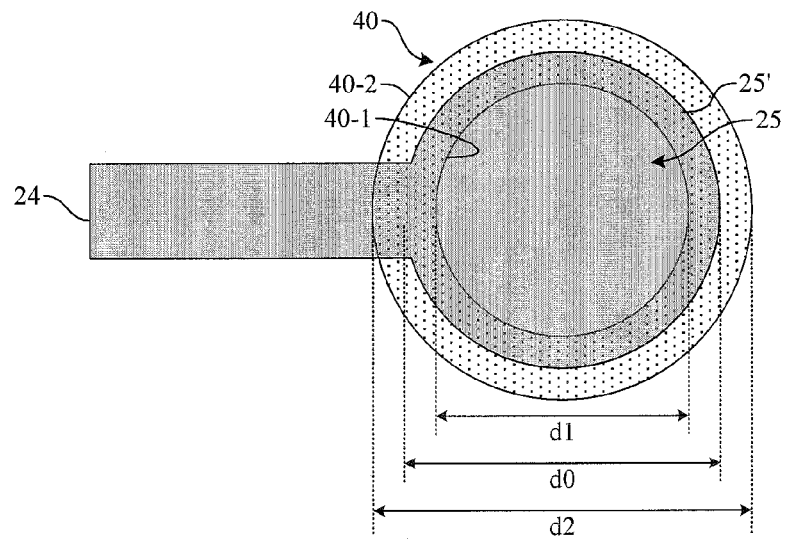
FIGS. 2A and 2B are, respectively, top and perspective views of a crack stop structure according to one embodiment of the present invention.
Figure 2B:
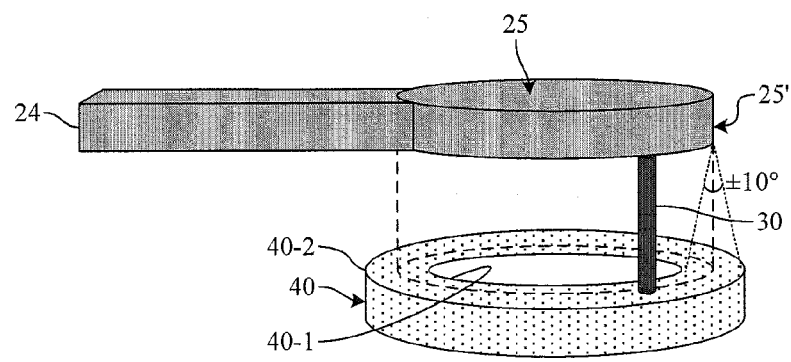

FIGS. 2A and 2B are top and perspective views of a crack stop structure 40 according to one embodiment. FIGS. 2A and 2B also show a conductive line 24 and a pad 25. For clarity, dielectric layers in which the conductive line, pad, and crack stop structure are formed are not shown.

As shown in FIG. 2A, the crack stop structure 40 is arranged below the conductive line 24 and the pad 25 (shown as being transparent). The pad may be nearly circular and has a diameter d0. In practice, the circular shape may be a polygon with a large number of sides (e.g. 16 sides or more). To simplify the present description, it should be understood that the term "circular" also includes such circle-approaching polygons.

The crack stop structure 40 conforms to an inner envelope 40-1 and an outer envelope 40-2, preferably both circular when the pad is circular, forming an annular structure. The inner envelope 40-1 has a diameter d1, and the outer envelope 40-2 has a diameter d2. The crack stop structure 40 is configured such that the vertical projection of the edge 25' of the pad is between the inner and outer envelopes of the crack stop structure. The diameters d1, d2 are, for example, chosen such that the average diameter of the annular structure may be equal to d0. The inner and outer diameters d1, d2 depend on the distance between the pad and the crack stop structure. In a preferred embodiment, for example, as shown in FIG. 2B, the inner and outer diameters, at the top of the structure, fall outside a ±10° downward facing angle starting at the edge of the pad.

As shown in FIG. 2B, a crack 30 appearing at the edge 25' of the pad propagates downward but encounters the crack stop structure 40. The crack stop structure blocks further downward propagation of the crack. The crack may be horizontally deviated, but may be less likely to cause damage to the underneath layers since most of its energy is dissipated by the crack bifurcation or the horizontal propagation.

The material used for the crack stop structure may preferably be resilient to crack penetration. A ductile material may be used. Such a property reduces crack propagation in case of a brittle fracture. More precisely, the material plasticity significantly increases the crack growth resistance and the propagation occurs rather in a brittle interface than in a ductile material. As a consequence, when the crack tip reaches the crack stop structure, the propagation to the lower level is stopped and the crack continues along the interface or is blocked. Suitable materials are thus metals, especially those available in semiconductor devices (e.g. aluminum, copper).

Preferably, the feature size used for the crack stop structure may be roughly the same as that of the underlying structures, so that the crack stop structure may not add stress. For this purpose, the cross-section of the crack stop structure may be chosen to be equal to the cross-section of a standard metal track of the first interconnect level.

Figure 1:
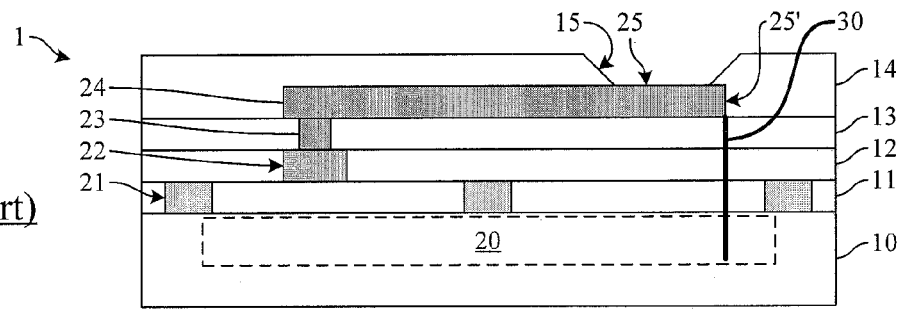
FIG. 1, previously described, is a cross-sectional view of a semiconductor device in accordance with the prior art.
Figure 3:
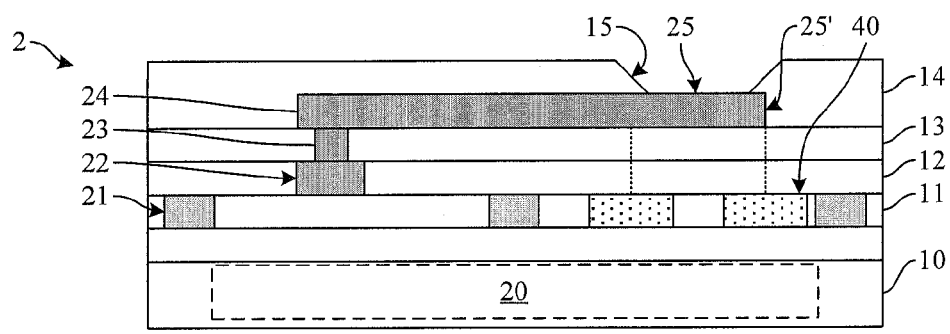
FIG. 3 is a cross-sectional view of a semiconductor device that includes a crack stop structure according to one embodiment of the present invention.

FIG. 3 is a cross-sectional view of a semiconductor device 2 including a crack stop structure 40 according to one embodiment. The semiconductor device 2 includes similar elements as the device of FIG. 1, designated by same reference numbers. The crack stop structure 40 is arranged in the dielectric layer 11 such that the vertical projection (shown in dotted lines) of the pad edge 25' falls within the perimeters defined by the inner and outer envelopes of the crack stop structure 40. In the case of a plurality of layers 11 that include conductive lines (metal tracks), the crack stop structure may preferably be arranged in the highest layer thereof.

Figure 4:
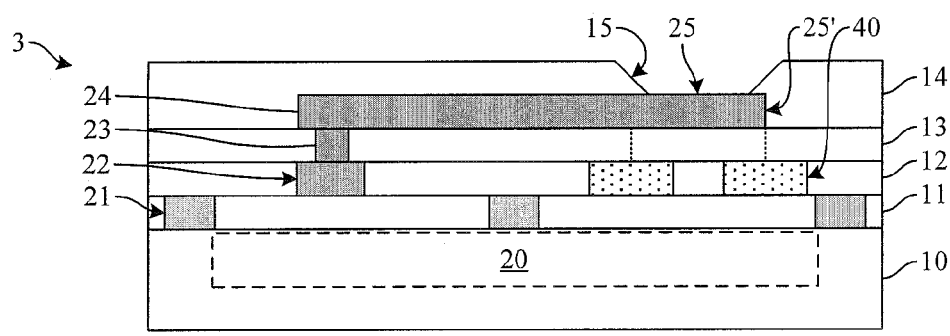
FIG. 4 is a cross-sectional view of a semiconductor device including a crack stop structure according to another embodiment of the present invention.

FIG. 4 is a cross-sectional view of a semiconductor device 3 that includes a crack stop structure 40, according to another embodiment. Semiconductor device 3 differs from semiconductor device 2 of FIG. 3 in that the crack stop structure 40 is arranged in the dielectric layer 12, again such that the vertical projection of the pad edge 25° falls within the perimeters defined by the inner and outer envelopes of the crack stop structure 40.

Figure 5:
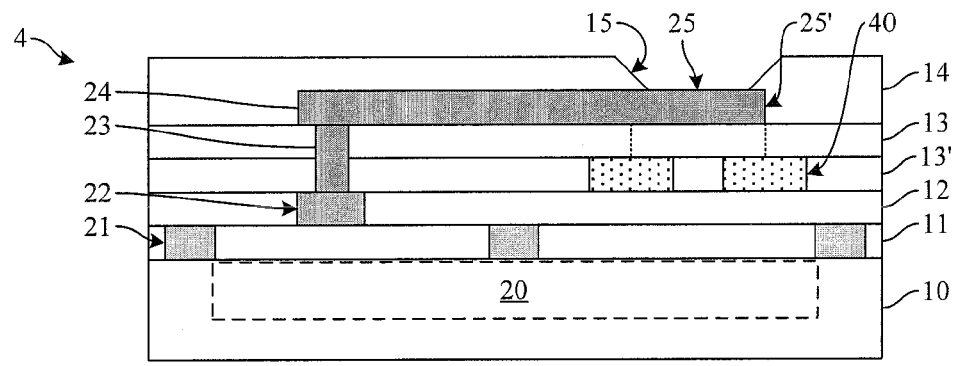
FIG. 5 is a cross-sectional view of a semiconductor device including a crack stop structure according to another embodiment of the present invention.

FIG. 5 is a cross-sectional view of a semiconductor device 4 that includes a crack stop structure 40, according to yet another embodiment. Semiconductor device 4 differs from semiconductor device 2 of FIG. 3 in that an additional dielectric layer 13' is formed above layer 12, and the crack stop 40 is arranged in layer 13'.

The crack stop structure 40 may preferably be of the same material as the other features 21, 22, 23, of the layer 11, 12, 13' in which it is formed. In this manner, the number of processing steps to fabricate the semiconductor device may not be increased. Nevertheless, the skilled person will understand that the crack stop may not be of the same material as the other elements of the layer in which it is present. In particular, it may be of a material more suitable for blocking or absorbing a crack.

Figure 6:
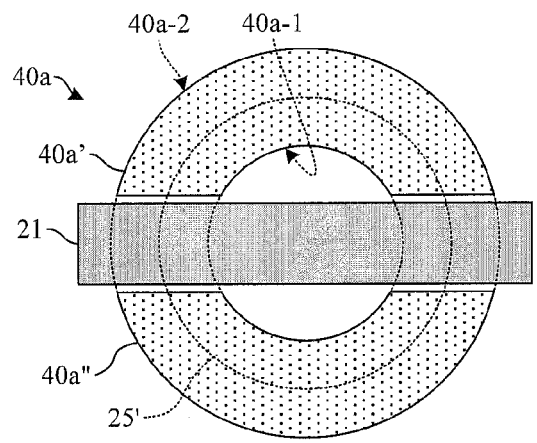
FIG. 6 is a top view of a crack stop structure according to another embodiment of the present invention.

FIG. 6 is a top view of an alternative crack stop structure 40a. A conductive track 21 traverses the crack stop structure due to routing. The crack stop structure is thus formed of two portions 40a', 40a" on each side of the track, and conforming to an inner envelope 40a-1 and an outer envelope 40a-2, shown in dashed lines. The separation between the edge of the conductive line 21 and each edge of the crack stop portions 40a', 40a" may preferably be the minimum separation possible according to design specifications.

Figure 7:
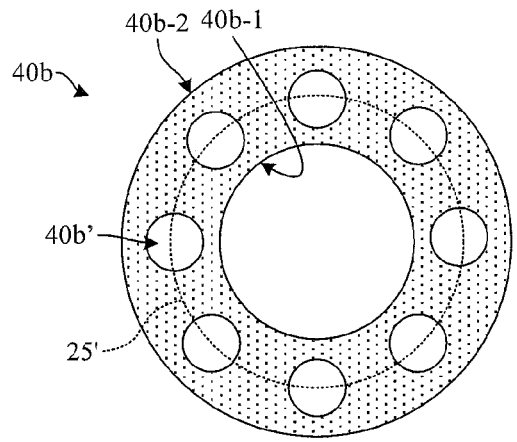
FIG. 7 is a top view of a crack stop structure according to another embodiment of the present invention.

FIG. 7 is a top view of a crack stop structure 40b according to another embodiment. As previously, the crack stop structure 40b conforms to an inner envelope 40b-1 and an outer envelope 40b-2. In addition, it has holes 40b' patterned around the structure, preferably at regular intervals, and centered on the projection of the pad edge 25'. Due to design specifications, it may be desirable to include such holes 40b' to reduce the quantity of metal and reduce local stress.

Figure 8:
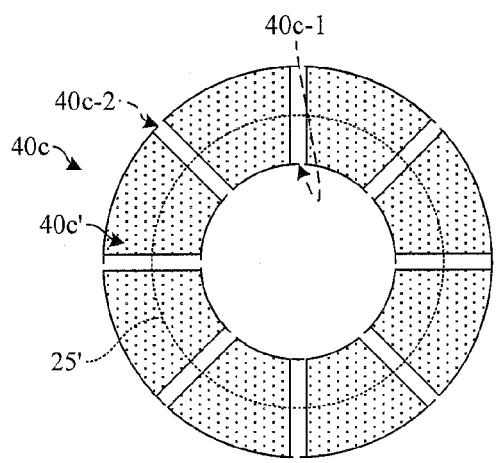
FIG. 8 is a top view of a crack stop structure according to another embodiment of the present invention.

FIG. 8 is a top view of a crack stop structure 40c according to another embodiment. As previously, the crack stop structure 40b conforms to an inner envelope 40b-1 and an outer envelope 40b-2. In addition, the structure is patterned into a plurality of equal size sectors 40c'. The separation between the sectors may preferably be a minimal value allowed by technology. This embodiment allows the local thermo-mechanical stress induced by the crack stop structure itself to be reduced.

Figure 9:
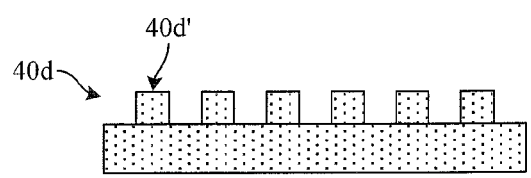
FIG. 9 is a side view of a crack stop structure according to another embodiment of the present invention.

FIG. 9 is a side view of a crack stop structure 40d according to another embodiment. The crack stop structure includes a plurality of radial walls 40d' patterned regularly on the top surface of the structure, that is to say, the surface facing the pad 25. The walls may increase or maximize the dissipation of the energy during a horizontal crack propagation occurring at the interface between crack stop and upper layer.

It will be understood by the skilled person that the present embodiments are susceptible to various implementation variations. Particularly, though the crack stop structure has been shown and described as having a circular or annular shape, it may have other shapes, such as square, depending on design specifications and the shape of pad 25. Furthermore, though the crack stop structure has been shown and described as annular, that is to say, having a missing central portion, it may be a full structure, for example, if due to its size or material the design specifications permit it. In this case, the "inner envelope" has a diameter of zero.

In addition, more than one crack stop structure may be provided, particularly in the case where the crack stop has holes, as shown in FIG. 7, or two or more sectors, as shown in FIGS. 6 and 8. The two or more crack stop structures may overlap and be rotated with respect to each other such that the holes of a higher crack stop structure are arranged above a full portion of a lower crack stop structure.

The semiconductor device 2, 3, 4 may evidently include other features not shown, such as passivation layers, and the like. Further, the features such as the chip pad 22, the conductive via and line 23, 24, and the pad 25 may each include two or more layers of different materials.

Finally, it will be understood that, though the terms "top surface", above, below, etc. have been used in the description, That which is claimed is:

1. A semiconductor device comprising:
   at least one pad exposed at a top surface of the semiconductor device; and
   a metal crack stop structure below said at least one pad and having an outer edge and opening therein defining an inner edge, and vertically aligned with said at least one pad so that an edge of the at least one pad is aligned between the inner and outer edges.

2. The semiconductor device according to claim 1, wherein said at least one pad has a circular shape; and wherein said metal crack stop structure has an annular shape.

3. The semiconductor device according to claim 2, wherein a top of said metal crack stop structure has an inner diameter and an outer diameter that are outside a ±10° downward facing angle from the edge of the at least one pad.

4. The semiconductor device according to claim 2, wherein said metal crack stop structure has an average diameter equal to a diameter of said at least one pad.

5. The semiconductor device according to claim 1, further comprising a dielectric layer having a plurality of electrical connection elements therein and carrying said metal crack stop structure; and wherein said metal crack stop structure and said plurality of electrical connection elements each comprises a same material.

6. The semiconductor device according to claim 5, wherein the material of said metal crack stop structure comprises at least one of copper and aluminum.

7. The semiconductor device according to claim 1, wherein said metal crack stop structure comprises radial walls extending outwardly from a top surface.

8. The semiconductor device according to claim 1, wherein said metal crack stop structure has a plurality of spaced apart openings aligned with the edge of said at least one pad.

9. The semiconductor device according to claim 1, wherein said metal crack stop structure comprises a plurality of spaced apart sectors.

10. The semiconductor device according to claim 1, further comprising a conductive track extending through said metal crack stop structure.

11. A semiconductor device comprising:
    at least one pad adjacent a top surface of the semiconductor device; and
    a crack stop structure below said at least one pad and having an outer edge and an opening therein defining an inner edge, and vertically aligned with said at least one pad so that an edge of the at least one pad is aligned between the inner and outer edges.

12. The semiconductor device according to claim 11, wherein said at least one pad has a circular shape; and wherein said crack stop structure has an annular shape.

13. The semiconductor device according to claim 12, wherein a top of said crack stop structure has an inner diameter and an outer diameter that are outside a ±10° downward facing angle from the edge of the at least one pad.

14. The semiconductor device according to claim 11, further comprising a dielectric layer having a plurality of electrical connection elements therein and carrying said crack stop structure; and wherein said crack stop structure and said plurality of electrical connection elements each comprises a same material.

15. The semiconductor device according to claim 11, wherein said crack stop structure comprises radial walls extending outwardly from a top surface.

16. The semiconductor device according to claim 11, wherein said crack stop structure has a plurality of spaced apart openings aligned with the edge of said at least one pad.

17. A method of making a semiconductor device comprising:
    positioning at least one pad adjacent a top surface of the semiconductor device; and
    positioning a crack stop structure having an outer edge and an opening therein defining an inner edge to be vertically aligned below the at least one pad so that an edge of the at least one pad is aligned between the and outer edges.

18. The method according to claim 17, wherein the at least one pad has a circular shape; and wherein the crack stop structure has an annular shape.

19. The method according to claim 18, wherein a top of the crack stop structure has an inner diameter and an outer diameter; and wherein the crack stop structure is positioned so that the inner and outer diameters are outside a ±10° downward facing angle from the edge of the at least one pad.

20. The method according to claim 17, wherein the crack stop structure is formed in a dielectric layer having a plurality of electrical connection elements therein; and wherein the crack stop structure and the plurality of electrical connection elements each comprises a same material.

21. The method according to claim 17, the crack stop structure comprises radial walls extending outwardly from a top surface.

22. The method according to claim 17, wherein positioning the crack stop structure comprises aligning a plurality of spaced apart openings of the crack stop structure with a top edge with the edge of the at least one pad.

* * * * *